United States Patent
Ohkubo et al.

(10) Patent No.: US 9,843,139 B2
(45) Date of Patent: Dec. 12, 2017

(54) SHIELD STRUCTURE, SHIELD SHELL, AND METHOD FOR MANUFACTURING SHIELD CONNECTOR WITH ELECTRIC WIRE

(71) Applicant: Yazaki Corporation, Minato-ku, Tokyo (JP)

(72) Inventors: Yoshitaka Ohkubo, Kakegawa (JP); Miki Nakamura, Kakegawa (JP); Takeshi Innan, Kakegawa (JP)

(73) Assignee: Yazaki Corporation, Minato-ku, Tokyo (JP)

( * ) Notice: Subject to any disclaimer, the term of this patent is extended or adjusted under 35 U.S.C. 154(b) by 0 days.

(21) Appl. No.: 15/135,665

(22) Filed: Apr. 22, 2016

(65) Prior Publication Data

US 2016/0240982 A1    Aug. 18, 2016

Related U.S. Application Data

(63) Continuation of application No. PCT/JP2014/080825, filed on Nov. 20, 2014.

(30) Foreign Application Priority Data

Nov. 20, 2013   (JP) .................. 2013-240271

(51) Int. Cl.
*H01R 13/6581* (2011.01)
*H01R 43/18* (2006.01)
(Continued)

(52) U.S. Cl.
CPC ......... *H01R 13/6581* (2013.01); *H01R 9/032* (2013.01); *H01R 13/655* (2013.01); *H01R 43/18* (2013.01); *H05K 9/0018* (2013.01)

(58) Field of Classification Search
CPC ............ H01R 13/6584; H01R 13/6581; H01R 13/655
See application file for complete search history.

(56) References Cited

U.S. PATENT DOCUMENTS 4,386,814 A * 6/1983 Asick .................. H01R 13/648
439/607.28
4,550,960 A * 11/1985 Asick ............... H01R 13/65802
439/607.01
(Continued)

FOREIGN PATENT DOCUMENTS

JP    2002-329557 A    11/2002
JP    2005-339933 A    12/2005
(Continued)

OTHER PUBLICATIONS

May 24, 2016—(WO) IPER and Written Opinion of the ISA—App PCT/JP2014/080825, Eng Tran.
(Continued)

*Primary Examiner* — Briggitte R Hammond
(74) *Attorney, Agent, or Firm* — Banner & Witcoff, Ltd.

(57) ABSTRACT

A shield structure includes a hollow tubular shield member, a shield shell having a plate-like shell body which is formed with a through hole, and a plate-like bent piece which is extended from an inner edge of the shell body that defines the through hole and which is bent to rise from the shell body, and an annular member which surrounds and fastens the bent piece, wherein at least one bent piece of the shield shell is extended from the inner edge of the shell body, and when the annular member surrounds and fastens the bent piece an outer surface of which is covered with a leading end in the longitudinal direction of the shield member, the leading end is clamped between the annular member and the bent piece.

7 Claims, 7 Drawing Sheets

(51) Int. Cl.
  *H01R 9/03* (2006.01)
  *H01R 13/655* (2006.01)
  *H05K 9/00* (2006.01)

(56) References Cited

U.S. PATENT DOCUMENTS

| | | | | |
|---|---|---|---|---|
| 4,571,012 | A * | 2/1986 | Bassler | H01R 13/65802 439/607.01 |
| 4,585,292 | A * | 4/1986 | Frantz | H01R 9/032 439/607.47 |
| 5,752,854 | A * | 5/1998 | Capp | H01R 13/743 439/607.28 |
| 5,959,244 | A * | 9/1999 | Mayer | G06F 1/182 174/355 |
| 6,206,730 | B1 * | 3/2001 | Avery | H01R 23/6873 439/607.18 |
| 6,241,555 | B1 * | 6/2001 | Okuyama | H01R 4/64 439/108 |
| 7,331,823 | B2 | 2/2008 | Fukushima et al. | |
| 7,357,675 | B2 * | 4/2008 | Barringer | H01R 13/65802 439/607.01 |
| 7,628,650 | B2 | 12/2009 | Aoki et al. | |
| 8,460,015 | B2 | 6/2013 | Deno et al. | |
| 2005/0266729 | A1 | 12/2005 | Fukushima et al. | |
| 2009/0126985 | A1 | 5/2009 | Aoki et al. | |
| 2012/0058670 | A1 * | 3/2012 | Regnier | H01R 13/65802 439/607.01 |
| 2012/0058674 | A1 | 3/2012 | Deno et al. | |
| 2013/0189879 | A1 * | 7/2013 | Kondo | H01R 9/18 439/607.44 |
| 2014/0238735 | A1 | 8/2014 | Adachi et al. | |
| 2014/0318852 | A1 | 10/2014 | Adachi et al. | |

FOREIGN PATENT DOCUMENTS

| | | |
|---|---|---|
| JP | 2008-288020 A | 11/2008 |
| JP | 2009-123519 A | 6/2009 |
| JP | 2010-268562 A | 11/2010 |
| JP | 2013-115071 A | 6/2013 |
| JP | 2013-115072 A | 6/2013 |

OTHER PUBLICATIONS

Feb. 24, 2015—International Search Report—Intl App PCT/JP2014/080825.

Sep. 14, 2017-(DE) Official Communication-App 11 2014 005 282.5.

* cited by examiner

SHIELD STRUCTURE, SHIELD SHELL, AND METHOD FOR MANUFACTURING SHIELD CONNECTOR WITH ELECTRIC WIRE

CROSS REFERENCE TO RELATED APPLICATIONS

This application is a continuation of PCT application No. PCT/JP2014/080825, which was filed on Nov. 20, 2014 based on Japanese Patent Application (No. 2013-240271) filed on Nov. 20, 2013, the contents of which are incorporated herein by reference.

BACKGROUND OF THE INVENTION

1. Technical Field

The present invention relates to a shield structure, a shield shell, and a method for manufacturing a shield connector with electric wire, and particularly to a structure of the shield shell.

2. Background Art

In JP-A-2010-268562, a shield electric wire fixing structure to attach a braiding of a shield electric wire to a shield shell of a shield connector is described. In the shield electric wire fixing structure of JP-A-2010-268562, while a braiding 22 is placed on the outer periphery of a small diameter part 41 of a shield shell 40, the braiding 22 is attached to the shield shell 40 by tightening a shield ring 30 to the small diameter part 41.

The small diameter part 41 of the shield shell 40 described in JP-A-2010-268562 has a hollow cylindrical shape which is extended from a body part 42 of the shield shell 40 in which an inner holder 50 is accommodated. The shield shell 40 including the small diameter part 41 and the body part 42 is molded by being twist-pressed.

Further, it is described in JP-A-2013-115072 that a shield shell is manufactured by die-casting.

SUMMARY OF THE INVENTION

However, for the shield shell having the hollow cylindrical tubular part which is tightened by the shield ring, as a technique to form the tubular part, it is necessary to adopt twist-pressing described in JP-A-2010-268562 or die-casting described in JP-A-2013-115072. When these techniques are adopted to manufacture the shield shell, the manufacturing cost increases because of the complexity of the manufacturing methods. Therefore, a shield shell is demanded which can be manufactured by a simpler method, and to which a braiding can be easily attached.

The present invention is made in view of the above circumstances, and the object of the present invention is to provide a shield structure, a shield shell of the shield structure, and a method of manufacturing a shield connector with electric wire so that the shield shell can be manufactured by a simpler method, and a braiding can be easily attached to the shield shell.

To achieve the previously described object, the shield structure according to the present invention is characterized by the following (1) to (6).

(1) A shield structure including:
a hollow tubular shield member,
a shield shell having a plate-like shell body which is formed with a through hole, and a plate-like bent piece which is extended from an inner edge of the shell body that defines the through hole and which is bent to rise from the shell body, and
an annular member which surrounds and fastens the bent piece, wherein at least one bent piece of the shield shell is extended from the inner edge of the shell body, and
when the annular member surrounds and fastens the bent piece the outer surface of which is covered with the leading end in the longitudinal direction of the shield member, the leading end is clamped between the annular member and the bent piece.

(2) The shield structure according to (1), wherein the shield shell has a plurality of the bent pieces which are extended from the inner edge of the shell body, and two of the plurality of the bent pieces are formed so that the planes including the bent pieces which are bent are parallel to each other or intersect.

(3) The shield structure according to (2), wherein at least two of the plurality of the bent pieces are formed to be parallel to each other and the entire surfaces of the bent pieces face each other.

(4) The shield structure according to any one of (1) to (3), wherein the shield structure further comprises a housing which holds an electric wire,
the outer surface, which faces the inner surface of the bent piece when the shell body is attached to penetrate the through hole, of the housing is flat, and
the inner surface of the bent piece which is fastened by the annular member is supported on the outer surface of the housing.

(5) The shield structure according to any one of (1) to (4), wherein the outer surface of the bent piece is provided with a protrusion or a ridge.

(6) The shield structure according to (5), wherein the inner surface of the bent piece is formed with a concave or a groove at a position corresponding to the protrusion or the ridge.

According to the shield structure of the constitution of the above (1), the shield shell has a shape that is molded only by punch-pressing and bend-pressing. Therefore, the manufacturing method can be simplified in comparison with a traditional manufacturing method of manufacturing a shield shell by twist-pressing or die-casting. Therefore, the manufacturing cost to manufacture the shield shell can be reduced.

According to the shield structure of the constitution of the above (2), a space is formed between two bent pieces which are bent, while an electric wire which penetrates through the through hole is accommodated in the space, the shield member can be attached to the shield shell. Therefore, the space where an electric wire is accommodated can be secured.

According to the shield structure of the constitution of the above (3), when the bent pieces are fastened by the annular member, a pressing force acts on the bent pieces uniformly. Therefore, it can be prevented that an excessive pressing force acts on a part of the bent pieces from the annular member.

According to the shield structure of the constitution of the above (4), even if the bent pieces are pushed by the annular member, a resisting force to resist the pushing acts from the outer surface of the housing to the bent pieces. Therefore, a displacement of the bent pieces is regulated by the housing, and the holding force to clamp the shield member between the annular member and the bent pieces becomes strong.

According to the shield structure of the constitution of the above (5), when the annular member is fastened by the protrusion or the ridge, the leading end of the shield member is clamped by the annular member and the protrusion or the ridge by a big pressure force.

According to the shield structure of the constitution of the above (6), the bent piece can be formed with the protrusion or the ridge easily.

To achieve the previously described object, the shield shell according to the present invention is characterized by the following (7).

(7) A shield shell including:

a plate-like shell body which is formed with a through hole, and at least one bent piece which is extended from an inner edge of the shell body that defines the through hole and is bent to rise from the shell body.

According to the shield shell of the constitution of the above (7), the shield shell has a shape that is molded only by punch-pressing and bend-pressing. Therefore, the manufacturing method can be simplified in comparison with a traditional manufacturing method of manufacturing a shield shell by twist-pressing or die-casting. Therefore, the manufacturing cost to manufacture the shield shell can be reduced.

To achieve the previously described object, the method of manufacturing a shield connector with electric wire according to the present invention is characterized by the following (8).

(8) A method of manufacturing a shield connector with electric wire, including:

a pressing step of forming a shield shell, which has a plate-like shell body which is formed with a through hole, and at least one bent piece which is extended from an inner edge of the shell body that defines the through hole and which is bent to rise from the shell body, by pressing a metal plate, an arranging step of arranging the leading end in the longitudinal direction of the shield member which is formed into a hollow tubular shape to the shell body to surround the through hole, and a fastening step of clamping the leading end in the longitudinal direction of the shield member between the bent piece and the annular member by surrounding and fastening the bent piece, the outer surface of which is covered with the leading end, with the annular member.

According to the manufacturing method of the shield connector with electric wire of the constitution of the above (8), the shield shell has a shape that is molded only by punch-pressing and bend-pressing. Therefore, the manufacturing method can be simplified in comparison with a traditional manufacturing method of manufacturing a shield shell by twist-pressing or die-casting. Therefore, the manufacturing cost to manufacture the shield shell can be reduced.

According to the shield structure, the shield shell and the method of manufacturing the shield connector with electric wire of the present invention, the shield shell can be manufactured by a simpler method, and the braiding can be attached to the shield shell easily.

The present invention has been briefly described above. Further, details of the invention will become more apparent after embodiments of the invention described below (hereinafter referred to as "embodiments") are read with reference to the accompanying figures.

BRIEF DESCRIPTION OF THE DRAWINGS

FIGS. 5A and 5B are figures to describe a shield shell of the first embodiment of the present invention, in which FIG. 5A is a front view, and FIG. 5B is a perspective view.

DETAILED DESCRIPTION OF EMBODIMENTS

Specific embodiments of the present invention are described below with reference to the figures. First, the first embodiment of the present invention is described.

[First Embodiment]

Figure 1:
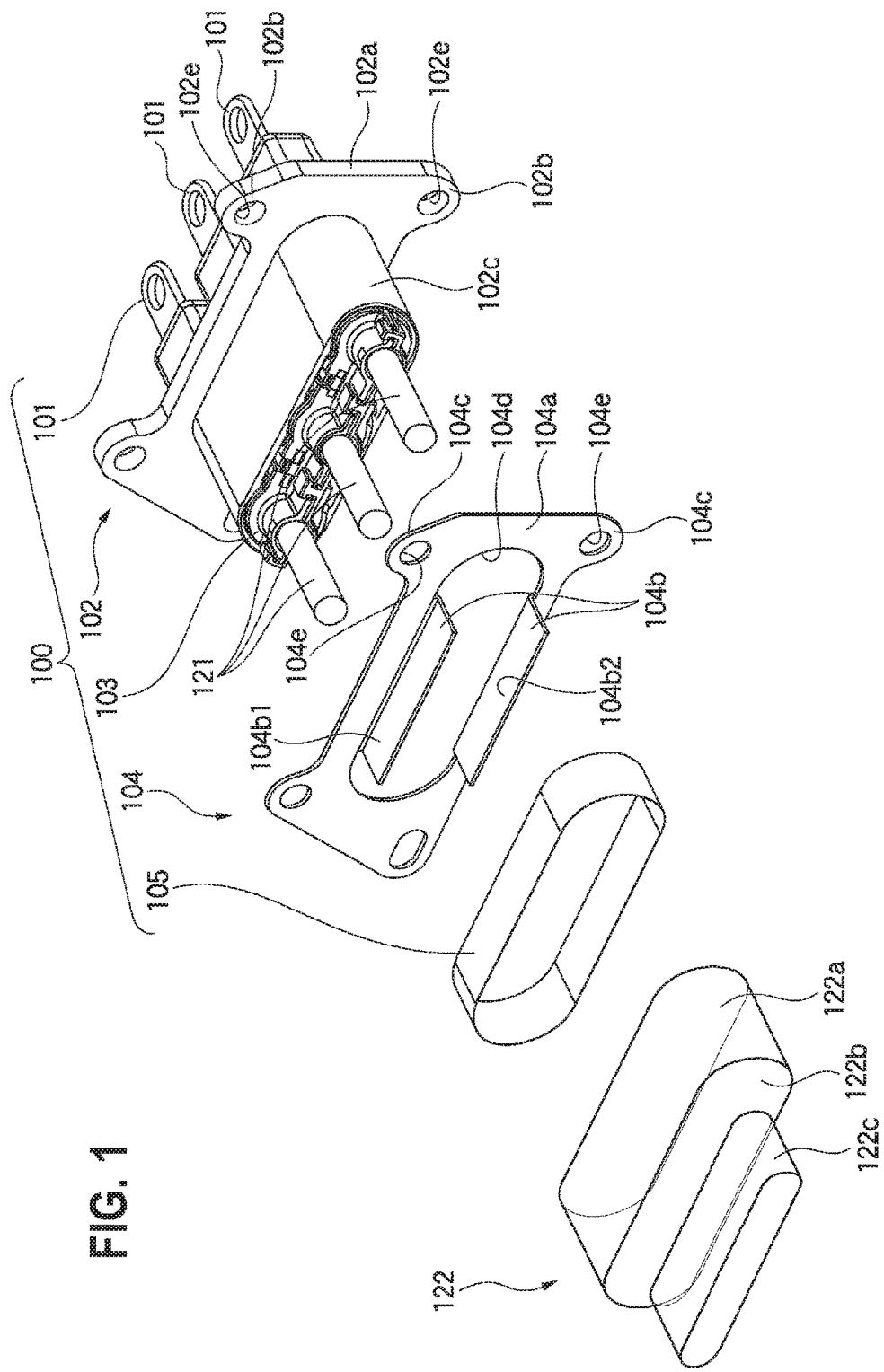
FIG. 1 is an exploded perspective view of a shield connector with electric wire of the first embodiment of the present invention.
Figure 2:
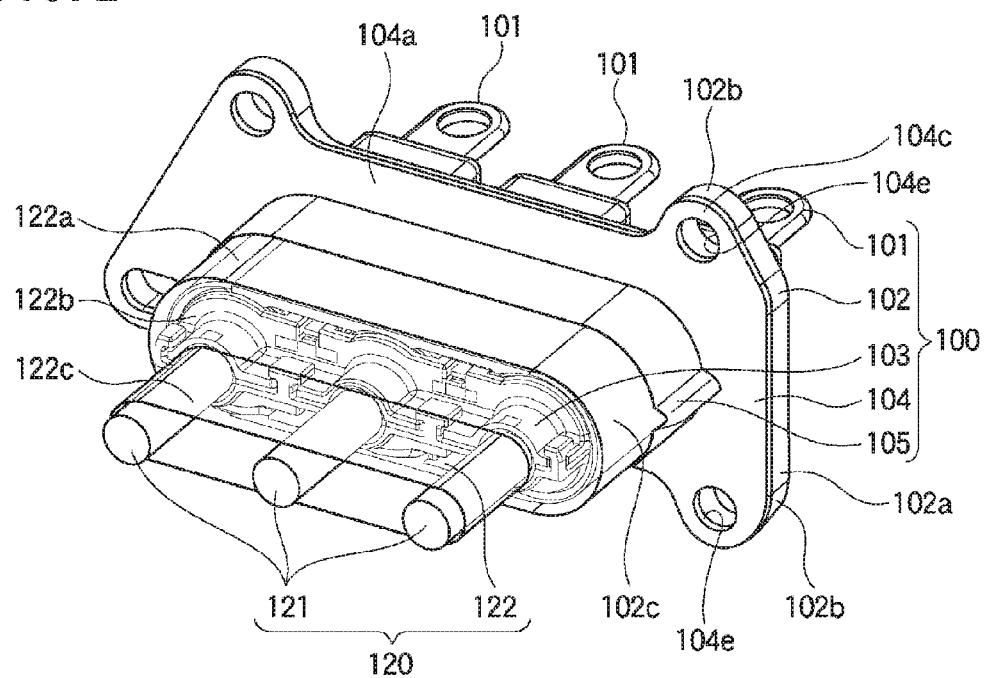
FIG. 2 is a perspective view of the shield connector with electric wire of the first embodiment of the present invention.
Figure 3:
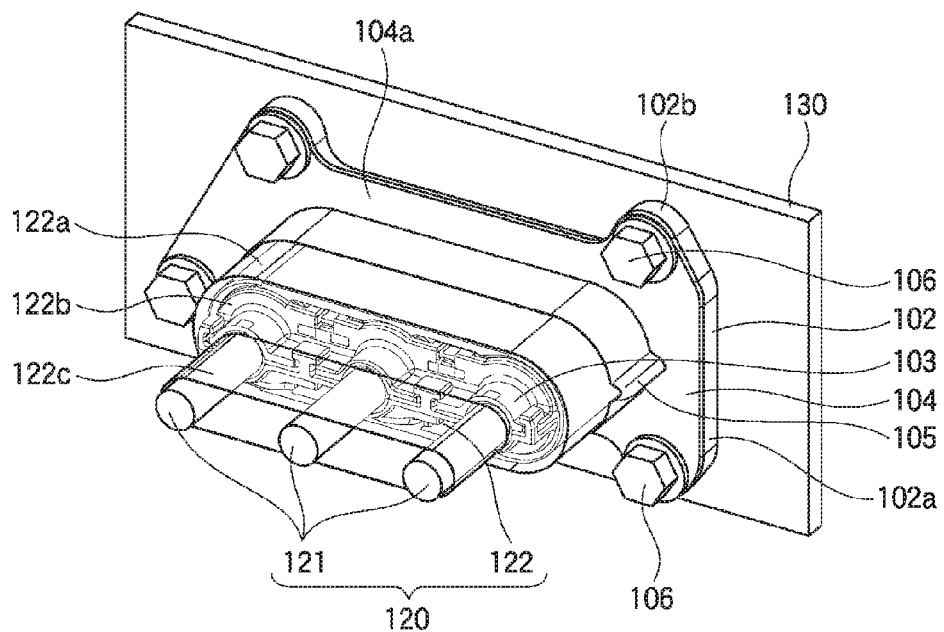
FIG. 3 is a perspective view in which the shield connector with electric wire of the first embodiment of the present invention is attached to a device side case.
Figure 4:
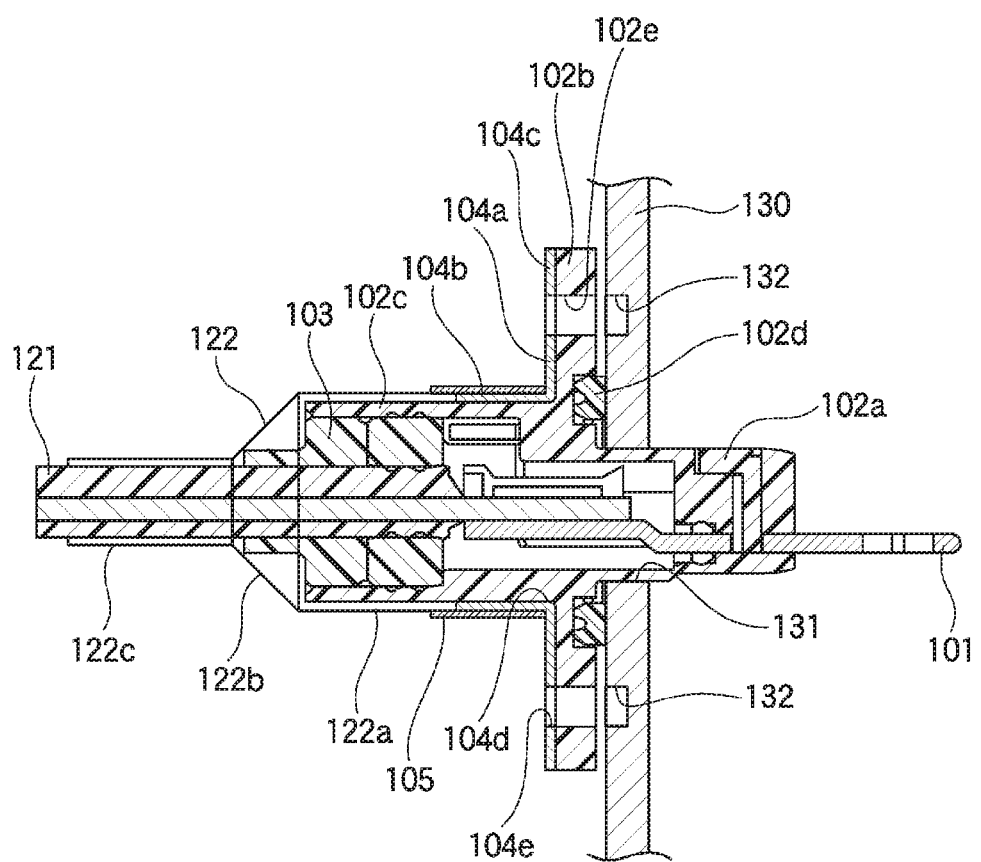
FIG. 4 is a sectional view in which the shield connector with electric wire of the first embodiment of the present invention is attached to the device side case.
Figure 5A:
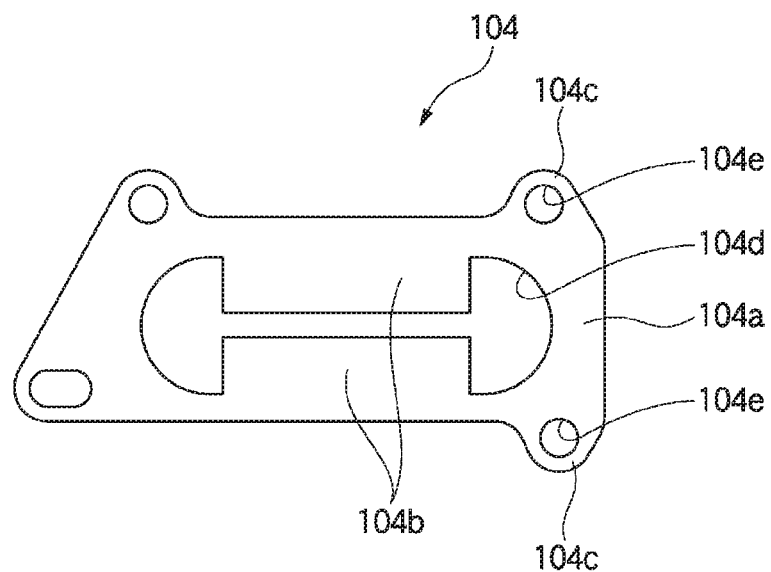
Figure 5B:
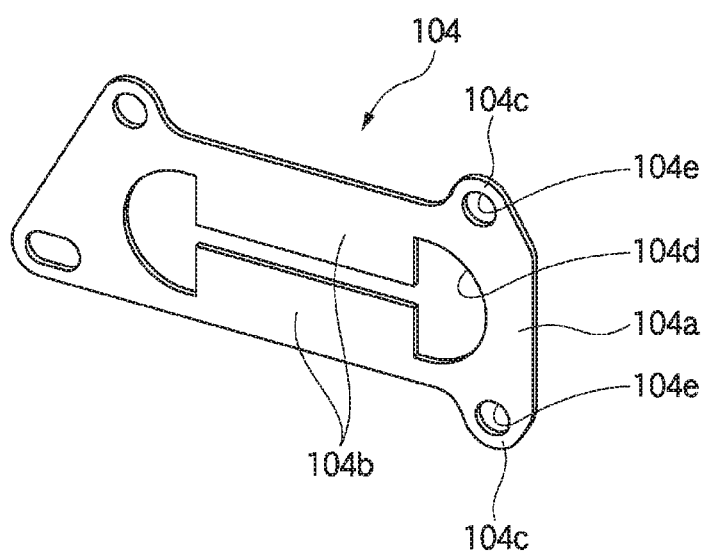
Figure 6:
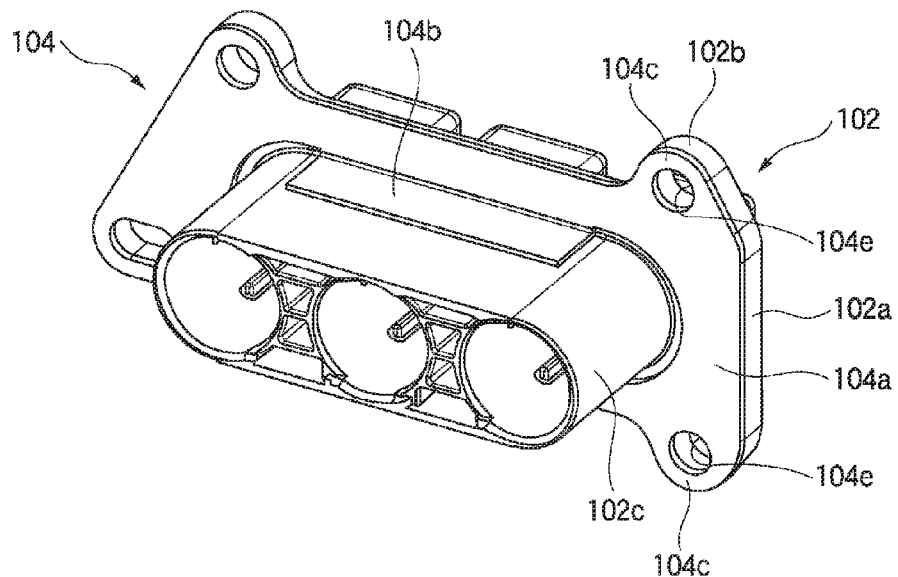
FIG. 6 is a perspective view which indicates that the shield shell of the first embodiment of the present invention is attached to a housing.
Figure 7:
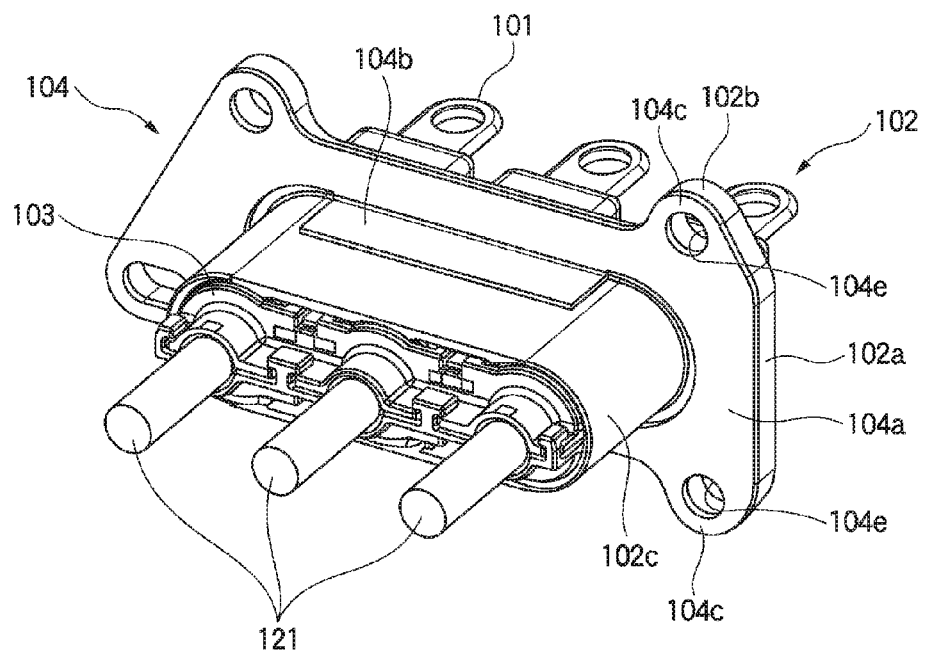
FIG. 7 is a perspective view which indicates that a rear holder is attached to the housing of FIG. 6.
Figure 8:
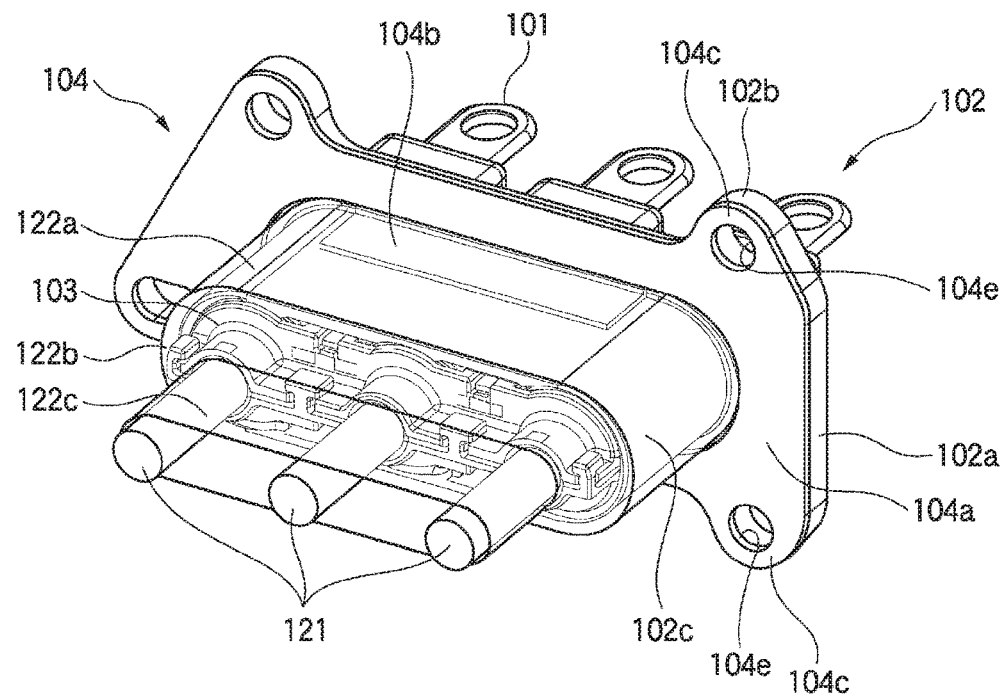
FIG. 8 is a perspective view which indicates that a braiding is attached to the housing of FIG. 7.

FIG. 1 is an exploded perspective view of a shield connector with electric wire of the first embodiment of the present invention. FIG. 2 is a perspective view of the shield connector with electric wire of the first embodiment of the present invention. FIG. 3 is a perspective view in which the shield connector with electric wire of the first embodiment of the present invention is attached to a device side case. FIG. 4 is a sectional view in which the shield connector with electric wire of the first embodiment of the present invention is attached to the device side case. FIGS. 5A and 5B are figures to describe a shield shell of the first embodiment of the present invention, in which FIG. 5A is a front view, and FIG. 5B is a perspective view. FIG. 6 is a perspective view which indicates that the shield shell of the first embodiment of the present invention is attached to a housing. FIG. 7 is a perspective view which indicates that a rear holder is attached to the housing of FIG. 6. FIG. 8 is a perspective view which indicates that a braiding is attached to the housing of FIG. 7.

[Constitution of Each Member of the First Embodiment]

A shield connector with electric wire of the first embodiment of the present invention includes a shield connector 100 and a shield electric wire 120, as shown in FIGS. 1 and 2. Various electric devices such as an inverter or a motor are loaded in an electric automobile or a hybrid automobile, and when the shield connector 100 is inserted into an insertion hole 131 which a housing (hereinafter referred to as device side case) 130 of the electric device is provided with, the electric device and the shield electric wire 120 are connected. The constitution of the shield connector 100 is described in detail as follows.

As shown in FIGS. 1 to 4, the shield connector 100 includes male terminals 101, a housing 102, a rear holder 103, a shield shell 104, a shield ring 105 and bolts 106.

The male terminal 101 is a metal member, and one end of the male terminal 101 is formed into a plate-like shape. The one end of the male terminal 101 is fitted into a female terminal (not shown) at the electric device side when the shield connector 100 is inserted into the insertion hole 131 which the device side case 130 is provided with. On the other hand, the other end of the male terminal 101 is joined to an electric wire 121 of the shield electric wire 120 by various methods such as laser joining or supersonic wave joining. Thereby, the electric device and the electric wires 121 are connected through the male terminals 101.

The housing 102 is a member which is molded by using resin material. The housing 102 includes a housing body 102a in which a terminal accommodating room, which accommodates the male terminals 101, is formed to hold the male terminals 101, four flanges 102b which are provided at the outer periphery of the housing body 102a, and a rear holder accommodating part 102c which is provided adjacently to the housing body 102a, and in which a rear holder accommodating room which is communicated with the terminal accommodating room of the housing body 102a is formed.

The housing body 102a is formed into a cuboid shape as a whole as shown in FIG. 1. The terminal accommodating room to accommodate the male terminals 101 is formed to penetrate through the housing body 102a along the direction in which the male terminals 101 are inserted. The terminal accommodating room has intervals in the height direction and in the widthwise direction in the surface which is perpendicular to the direction in which the male terminals 101 are inserted, and the intervals are the same as the board thicknesses in the height direction and in the widthwise direction in the surface which is perpendicular to the longitudinal direction of the male terminals 101. Thereby, the male terminals 101 which are accommodated in the terminal accommodating room are held in the terminal accommodating room. The outer diameter of one part of the housing body 102a is slightly smaller than the inner diameter of the insertion hole 131 which the device side case 130 is provided with. Thereby, when the housing body 102a is inserted into the insertion hole 131, the housing body 102a is provisionally held in the insertion hole 131. The outer diameter of the other part of the housing body 102a is bigger than the inner diameter of the insertion hole 131. Thereby, when the housing body 102a is inserted into the insertion hole 131, the other part of the housing body 102a contacts the device side case 130, and the housing body 102a is regulated from being further inserted. Further, a circular waterproofing packing 102d may be provided on the outer surface of the housing body 102a, and when the housing body 102a is inserted into the insertion hole 131, the waterproofing packing 102d prevents water that reaches the space between the housing body 102a and the device side case 130 from invading.

As shown in FIGS. 1-3, the four flanges 102b are provided to project from the outer periphery of the housing body 102a. These flanges 102b are arranged at positions facing each other across the center of the housing body 102a. Particularly, in this first embodiment, two of these flange 102b are arranged to line up at positions respectively above and below the male terminals 101 which are held in the housing body 102a. These flanges 102b are respectively formed with bolt holes 102e which penetrate through the flanges 102b in the board thickness direction. On the other hand, the device side case 130 is provided with four bolt holes 132 to sandwich the insertion hole 131. These four bolt holes 132 are formed at positions corresponding to the four bolt holes 102e which the flanges 102b are respectively provided with. When the housing body 102a is inserted into the insertion hole 131, the housing body 102a is aligned so that the positions of the bolt holes 132 which the device side case 130 is provided with correspond to the positions of the bolt holes 102e which the flanges 102b are provided with, as shown in FIGS. 3 and 4.

The rear holder accommodating part 102c has a rear holder accommodating room into which the rear holder 103 which has held the male terminals 101 is inserted. At this time, while the male terminals 101 penetrate through the rear holder accommodating room of the rear holder accommodating part 102c, and further penetrate through the terminal accommodating room of the housing body 102a, the male terminals 101 are held in the terminal accommodating room of the housing body 102a. The rear holder accommodating part 102c is provided with an engaging mechanism which engages with the rear holder 103 which is accommodated in the rear holder accommodating room. Thereby, the rear holder 103 is maintained to be accommodated in the rear holder accommodating part 102c.

The rear holder 103 is a member molded by using resin material. The rear holder 103 is formed with through holes, and the electric wires 121 joined to the male terminals 101, when inserted into the through holes, are held by the inner surfaces of the through holes. In this way, the electric wires 121 are fixed to the rear holder 103. The rear holder 103 to which the electric wires 121 are fixed in this way holds the male terminals 101 that extend to one side and holds the electric wires 121 that extend to the opposite side, as shown in FIG. 1. The rear holder 103 is provided with an engaging mechanism which engages with the rear holder accommodating part 102c when the rear holder 103 enters the rear holder accommodating part 102c. When this engaging mechanism engages with the engaging mechanism which the rear holder accommodating part 102c is provided with, the rear holder 103 is maintained to be accommodated in the rear holder accommodating part 102c.

The shield shell 104 is a metal member, and, as shown in FIGS. 5A and 5B, is formed as a whole into a circular shape to which the leading end in the longitudinal direction of a shield member, which is formed into a hollow tubular shape, is attached. The shield shell 104 is made by processing, or punch-pressing and bend-pressing a plate-like metal plate. The shield shell 104 includes a plate-like shell body 104a which is formed with a through hole 104d, a plurality of bent pieces 104b which are extended from the inner edge of the shell body 104a which defines the through hole 104d, and four flanges 104c which are extended from the outer edge of the shell body 104a.

As shown in FIGS. 5A and 5B, the outer edge of the shell body 104a is formed into a rectangular shape. Inside the shell body 104a, the through hole 104d is bored. The inner edge of the shell body 104a defining the through hole 104d is formed into a rectangular shape whose four corners are rounded. The inner edge (the through hole 104d) of the shell body 104a and the outer edge of the shell body 104a are formed so that their centers correspond to each other. The shape of the outer edge of the shell body 104a substantially match the shape of the outer edge of the bottom surface (surface connected to the rear holder accommodating part 102c) of the housing body 102a, as shown in FIGS. 1, 3, 6 and 7. In this first embodiment, it is described that the inner edge of the shell body 104a and the outer edge of the shell body 104a have rectangular shapes, but the inner edge and the outer edge may have a round shape, an elliptical shape, a polygonal shape or the like.

The bent pieces 104b are plate-like members which are formed by bend-pressing rectangular pieces, which are punch-pressed to extend toward the central side from the inner edge of the shell body 104*a*, as shown in FIGS. 5A and 5B, to the shell body 104*a* to be bent to rise from the shell body 104*a*, as shown in FIG. 1.

In this first embodiment, both sides (above and below the through hole 104*d* in FIG. 5A) across the center of the through hole 104*d* are provided with the bent pieces 104*b*, respectively. The two bent pieces 104*b* are rectangular and have the same shape. When these two bent pieces 104*b* are bent to the shell body 104*a*, the two bent pieces 104*b* are located in parallel to each other and the entire surfaces of the bent pieces 104*b* face each other. The electric wires 121 which penetrate through the through hole 104*d* are placed between the two bent pieces 104*b* which are bent.

The four flanges 104*c* are formed by being punch-pressed to extend outward radially from the outer edge located at the four corners of the shell body 104*a*, as shown in FIGS. 5A to 5B. These flanges 104*c* are respectively formed with bolt holes 104*e* which penetrate through the flanges 104*c* in the board thickness direction. The bolt holes 104*e* which these flanges 104*c* are respectively provided with are provided at positions corresponding to the bolt holes 102*e* which the flanges 102*b* of the housing 102 are respectively provided with. When the shield shell 104 is attached to the housing 102, the shield shell 104 is aligned so that the positions of the two bolt holes 102*e* which the flanges 102*b* of the housing 102 are respectively provided with correspond to the positions of the two bolt holes 104*e* which the flanges 104*c* of the shield shell 104 are respectively provided with, as shown in FIGS. 2 and 4.

The shield ring 105 is an annular member that surrounds and fastens the bent pieces 104*b*. The shield ring 105 has a hollow tubular shape, as shown in FIG. 1. As shown in FIGS. 2 and 3, the shield ring 105 surround and fastens the bent pieces 104*b*, whose outer surfaces 104*b*1 are covered with the leading end in the longitudinal direction of the shield member, and the rear holder accommodating part 102*c* of the housing 102, to keep the bent pieces 104*b* and the rear holder accommodating part 102*c* inside the shield ring 105. Thus, the leading end in the longitudinal direction of the shield member is clamped between the shield ring 105 and the bent pieces 104*b*. In this way, the shield ring 105 fixes the shield member to the bent pieces 104*b*. In this first embodiment, it is described that the annular member is constructed of the shield ring 105, but the annular member is not limited to the shield ring. The shield ring can be replaced with a member (for example, a binding band) which can maintain that the shield member is pushed to the bent pieces 104*b*.

The four bolts 106 are metal members, and engage threadedly into the bolt holes 132 which the device side case 130 is provided with. When the shield connector 100 is attached to the device side case 130, as shown in FIG. 4, while the bolts 106 penetrate through the bolt holes 104*e* which the flanges 104*c* of the shield shell 104 are provided with and penetrate through the bolt holes 102*e* which the flanges 102*b* of the housing 102 are provided with, the bolts 105 engage threadedly into the bolt holes 132 which the device side case 130 is provided with. By fastening the four bolts 106 in this way, as shown in FIG. 4, the shield shell 104 is fixed to the housing 102 and the housing 102 is fixed to the device side case 130.

Now, it is necessary for the shield shell 104 to be grounded to the GND of the electric device. In realizing this grounding, since the whole device side case 130 is made of metal and the bolt holes 132 of the device side case 130 are made of metal, the device side case 130 or the bolt holes 132 are kept electrically connected to the GND of the electric device. Thus, by engaging threadedly and fastening the bolts 106 to the bolt holes 132, the shield shell 104 and the device side case 130 or the bolt holes 132 are electrically connected through the bolts 106. In this way, the GNDs of the shield shell 104 and the electric device can be commonized.

Then, the constitution of the shield electric wire 120 is described. The shield electric wire 120 includes the electric wires 121 and a braiding 122.

The electric wire 121 is constructed of a core wire and an insulative coating which covers the core wire. The electric wires 121 are assembled to the rear holder 103 while the core wires are joined to the male terminals 101. In this first embodiment, as shown in FIGS. 1 and 2, the shield electric wire 120 is arranged so that three electric wires are adjacent to each other. When the electric device to which the shield connector 100 is connected is a device in need of the supply of a relatively big electric current such as an inverter or a motor, the shapes of the core wires and the insulative coatings of the electric wires 121 are designed according to the current value appropriately.

The braiding 122 is formed into a hollow tubular shape by braiding strands having conductivity. The braiding 122 is a member equivalent to the shield member. The braiding 122 may be formed by braiding strands which are made, for example, by plating elastic fiber such as nylon. As shown in FIGS. 2 and 3, the braiding 122 is arranged around the three electric wires 121 to cover the three electric wires 121. The shield member of the present invention is not limited to a braiding. A conductive member (for example, a metal foil or the like) which is formed into a hollow tubular shape can be applied as the shield member of the present invention.

[Procedure of Attaching the Braiding to the Shield Shell and Shield Structure]

Next, a procedure of attaching the braiding 122 to the shield shell 104 and a shield structure in which the braiding 122 is attached to the shield shell 104 are described.

At first, before the braiding 122 is attached to the shield shell 104, it is necessary to prepare the shield shell 104 and the braiding 122 beforehand. The shield shell 104 which has the shell body 104*a*, the bent pieces 104*b*, the flanges 104*c* and the through hole 104*d* is formed into a plate shape by punch-pressing a metal plate, as shown in FIGS. 5A and 5B. Right after the shield shell 104 is punch-pressed, the bent pieces 104*b* are extended on a plane including the shell body 104*a*.

After the punch-pressing, as shown in FIG. 1, the shell tightening pieces 104*b* are bent to be substantially perpendicular to the shell body 104*a* by being bend-pressed. Using the shield shell 104 formed in this way, the following steps are carried out.

On the other hand, for the braiding 122, an end of the braiding 122 is processed to be widened toward one longitudinal end of the braiding 122, as shown in FIG. 1. Specifically, the diameter of the braiding 122 increases in an order of a small diameter part 122*c* which covers the two electric wires 121 at a position that is the nearest to the electric wires 121, a diameter enlarging part 122*b* which extends from the end of the small diameter part 122*c* and whose diameter is enlarged progressively from the small diameter part 122*c*, and a leading end 122*a* which extends from the end of the diameter enlarging part 122*b* in the longitudinal direction of the braiding 122. The leading end 122*a* is roughly formed into a rectangular shape, and the size of the leading end 122*a* is bigger than the size of the through hole 104*d*. Thereby, when the braiding 122 is attached to the shield shell 104, the leading end 122*a* can accommodate the through hole 104*d* inside.

Using the shield shell 104 and the braiding 122 formed in this way, the braiding 122 is attached to the shield shell 104. At first, as shown in FIG. 6, the shield shell 104 is attached to the housing 102. Specifically, while the rear holder accommodating part 102*c* of the housing 102 is inserted through the through hole 104*d* of the shield shell 104, the shield shell 104 is brought close to the housing 102 until the shell body 104*a* of the shield shell 104 abuts against the housing body 102*a* of the housing 102. At this time, as shown in FIG. 6, surfaces, which are opposed to inner surfaces 104*b*2 of the bent pieces 104*b*, of the periphery of the rear holder accommodating part 102*c* are flat. Therefore, as shown in FIG. 4, the outer surfaces of the rear holder accommodating part 102*c* to which the shell body 104*a* is attached to penetrate through the through hole 104*d* are opposed to the inner surfaces 104*b*2 of the bent pieces 104*b*, and surface-touches the inner surfaces 104*b*2 of the bent pieces 104*b*.

Then, as shown in FIG. 7, the rear holder 103 to which the electric wires 121 which are joined to the male terminals 101 are assembled is inserted into the housing 102.

Then, as shown in FIG. 8, the braiding 122 is brought close toward the shield shell 104, and the braiding 122 is placed at the shell body 104*a* so that the leading end 122*a* surrounds the through hole 104*d*. At this time, the leading end 122*a* accommodates the bent pieces 104*b* inside.

As shown in FIG. 2, the shield ring 105 is placed to keep the bent pieces 104*b*, whose outer surfaces 104*b*1 are covered with the leading end 122*a*, and the rear holder accommodating part 102*c* of the housing 102 inside the shield ring 105, and is tightened in this state. Thus, the leading end in the longitudinal direction of the shield member is clamped between the shield ring 105 and the bent pieces 104*b*. At this time, the bent pieces 104*b* fastened by the shield ring 105 are supported by the outer surface of the rear holder accommodating part 102*c*. In this way, the shield ring 105 fixes the shield member to the bent pieces 104*b*. In this way, the shield connector with electric wire including the shield structure in which the braiding 122 is attached to the shield shell 104 is completed.

After this, as shown in FIG. 3, the shield connector with electric wire is attached to the device side case 130. At this time, the shield connector with electric wire is aligned so that the housing body 102*a* is inserted into the insertion hole 131, and the positions of the bolt holes 132 which the device side case 130 is provided with correspond to the positions of the bolt holes 102*e* which the flanges 102*b* are provided with. While the bolts 106 penetrate through the bolt holes 104*e* which the flanges 104*c* of the shield shell 104 are provided with and the bolt holes 102*e* which the flanges 102*b* of the housing 102 are provided with, the bolts 105 engage threadedly into the bolt holes 132 which the device side case 130 is provided with. By fastening the four bolts 106 in this way, the shield shell 104 is fixed to the housing 102 and the housing 102 is fixed to the device side case 130.

In the shield structure in which the braiding 122 is attached to the shield shell 104, the braiding 122 is grounded to the GND of the electric device through the shield shell 104. In this way, for the shield structure of the present invention, a shielding function is implemented by the shield shell 104 and the braiding 122.

[Effect of the First Embodiment]

According to the first embodiment of the present invention above, the shield shell 104 adopted in the shield connector 100 has a shape which is molded only by punch-pressing and bend-pressing. Therefore, the manufacturing method can be simplified in comparison with a traditional manufacturing method of manufacturing a shield shell by twist-pressing or die-casting. Therefore, the manufacturing cost to manufacture the shield shell 104 can be reduced. As a result, the cost of a wire harness in which the shield connector is included as a component can be reduced.

According to the first embodiment of the present invention, for the plate-like shield shell 104 just after being made by punch-pressing a metal plate, the bent pieces 104*b* are located at places where the through hole 104*d* should be formed, as shown in FIGS. 5A and 5B. By this structure, when the metal plate is punch-pressed, the range which is punched to be removed from the plate is decreased by the range of the two bent pieces 104*b*. In other words, the parts that were supposed to be removed by being punched to form the through hole 104*d* can be utilized as the two bent pieces 104*b*. Therefore, the loss of the metal plate with the punch-pressing is reduced, and the plate can be utilized more effectively.

Further, in the first embodiment of the present invention, the two bent pieces 104*b* are formed parallel to each other and the entire surfaces of the bent pieces 104*b* face each other. By this structure, when the bent pieces 104*b* are tightened by the shield ring 105, a pressing force acts on the bent pieces 104*b* uniformly. Therefore, it can be prevented that an excessive pressing force acts on a part of the bent pieces 104*b* from the shield ring 105.

The shield shell of the present invention is not limited to include the two bent pieces 104*b* which are parallel to each other and the entire surfaces of which face each other. That is, the shield shell of the present invention is not limited to include a plurality of the bent pieces 104*b*. If the shield shell includes at least one bent piece 104*b*, the braiding 122 can be attached to the shield shell 104.

When the shield shell of the present invention includes a plurality of the bent pieces 104*b*, it is desirable that a space is formed to accommodate the electric wires 121 between the two bent pieces 104*b* which are bent. In other words, it is possible that the two bent pieces 104*b* which are bent are not located at the same plane, but the planes including the bent pieces 104*b* are parallel to each other or intersect. By locating the bent pieces 104*b* in this way, a space is formed between the two bent pieces 104*b* which are bent, and while the electric wires which penetrate through the through hole 104*d* are accommodated in the space, the braiding 122 can be attached to the shield shell 104. Therefore, the space where the electric wires are accommodated is secured. It is also possible that the shield shell includes at least two bent pieces 104*b*, and those bent pieces 104*b* are formed to line up on the same plane. Even in this case, the braiding 122 can be attached to the shield shell 104.

In the first embodiment of the present invention, the inner surfaces 104*b*2 of the bent pieces 104*b* which are fastened by the shield ring 105 are supported on the outer surface of the rear holder accommodating part 102*c* of the housing 102. Thereby, even if the bent pieces 104*b* are pushed by the shield ring 105, a resisting force to resist the pushing acts on the bent pieces 104*b* from the outer surfaces of the rear holder accommodating part 102*c*. Therefore, a displacement of the bent pieces 104*b* is regulated by the rear holder accommodating part 102*c*, and the holding force to clamp the braiding 122 between the shield ring 105 and the bent pieces 104*b* becomes strong.

In the first embodiment of the present invention, it is described that the shield structure of the present invention is applied to the shield connector 100, but the present invention is not limited to this. It is also possible that upon connecting the leading end of the shield electric wire 120 to the electric device, while the electric wires 121 pass the through hole 104d, the shield shell 104 to which the braiding 122 is attached is directly fixed to the device side case 130, and the device side case 130 and the shield shell 104 are electrically connected.

Subsequently, the second embodiment of the present invention is described.

[Second Embodiment]

Figure 9:
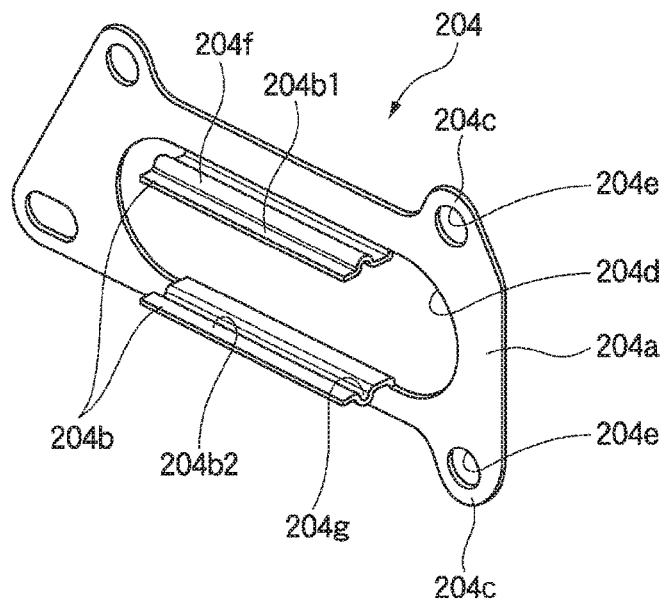
FIG. 9 is a perspective view of a shield shell of the second embodiment of the present invention.

The second embodiment of the present invention is different from the first embodiment in the shape of the shield shell. Therefore, in the second embodiment, the shape of the shield shell is described. Members except the shield shell are common to the first embodiment, and their description is omitted. FIG. 9 is a perspective view of the shield shell of the second embodiment of the present invention.

A shield shell 204 of the second embodiment of the present invention is different from the shield shell 104 of the first embodiment in the shape of bent pieces 204b, as shown in FIG. 9. A shell body 204a, flanges 204c, a through hole 204d and bolt holes 204e are the same as the shell body 104a, the flanges 104c, the through hole 104d and the bolt holes 104e of the shield shell 104 of the first embodiment.

The bent pieces 204b are plate-like members which are formed by bend-pressing rectangular pieces, which are punch-pressed to extend toward the central side from the inner edge of the shell body 204a, to the shell body 104a to be bent to rise from the shell body 104a, as shown in FIG. 9.

In this second embodiment, both sides (above and below the through hole 204d in FIG. 9) across the center of the through hole 104d are provided with the bent pieces 204b, respectively. The two bent pieces 204b are rectangular and have the same shape. When these two bent pieces 204b are bent to the shell body 204a, the two bent pieces 104b are located in parallel to each other and the entire surfaces of the bent pieces 104b face each other. The electric wires 121 which penetrate through the through hole 204d are placed between the two bent pieces 204b which are bent.

The bent pieces 204b are formed with ridges 204f on outer surfaces 204b1, and grooves 204g at positions corresponding to the ridges 204f on inner surfaces 204b2. The ridges 204f and the grooves 204g are provided along the longitudinal direction of the bent pieces 204b.

In this second embodiment, to further raise the gripping force of the bent pieces 204b and the shield ring 105 to grip the leading end 122a of the braiding 122, a structure shown in FIG. 9 is adopted in the bent pieces 204b. When the shield ring 105 is tightened by the ridges 204f, the leading end 122a is clamped by the shield ring 105 and the ridges 204f by a big pressure force. Therefore, the leading end 122a is fixed to the shield shell 204 more strongly by the bent pieces 204b and the shield ring 105. Thus, the braiding 122 can be prevented from falling off from the shield shell 204.

The above ridges 204f are formed, for example, by locally pushing surfaces (inner surfaces 204b2) opposite to the surfaces (outer surfaces 204b1) where the ridges 204f are provided in the bent pieces 204b, when the shield shell 204 is bend-pressed. In this case, the bent pieces 204b are formed with the grooves 204g at positions corresponding to the ridges 204f, as shown in FIG. 9. Thus, by forming the ridges 204f at the time of bend-pressing, the bent pieces 204b can be easily formed with the ridges 204f. If the ridges 204f are formed by locally pushing the surfaces opposite to the surfaces where the ridges 204f are formed, it becomes easy to adjust the projection height of the ridges 204f which project from the bent pieces 204b. The method to form the ridges 204f is not limited to the above method. The ridges 204f may be formed at the time of punch-pressing, and the ridges 204f may be formed at desired places on the plate-like metal plate before pressing.

Subsequently, the third embodiment of the present invention is described.

[Third Embodiment]

Figure 10:
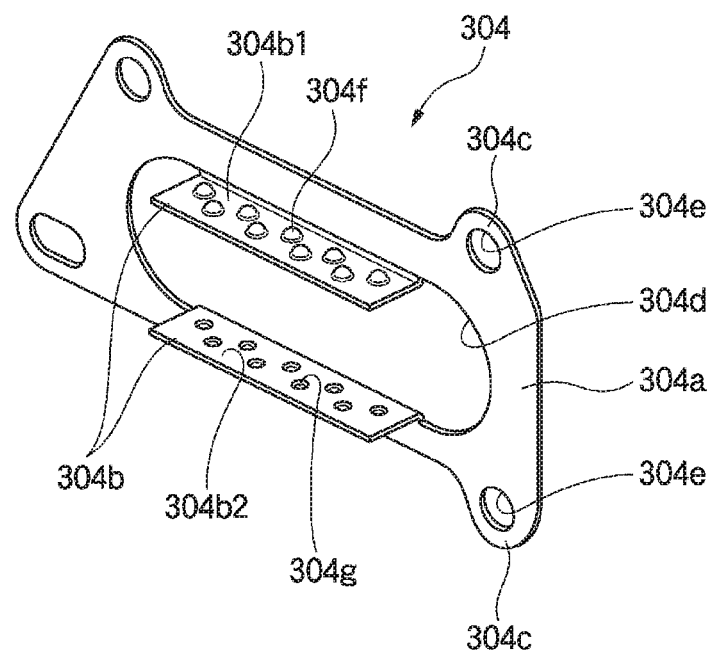
FIG. 10 is a perspective view of a shield shell of the third embodiment of the present invention.

The third embodiment of the present invention is different from the first embodiment in the shape of the shield shell. Therefore, in the third embodiment, the shape of the shield shell is described. Members except the shield shell are common to the first embodiment, and their description is omitted. FIG. 10 is a perspective view of the shield shell of the third embodiment of the present invention.

A shield shell 304 of the third embodiment of the present invention is different from the shield shell 104 of the first embodiment in the shape of bent pieces 304b, as shown in FIG. 10. A shell body 304a, flanges 304c, a through hole 304d and bolt holes 304e are the same as the shell body 104a, the flanges 104c, the through hole 104d and the bolt holes 104e of the shield shell 104 of the first embodiment.

The bent pieces 304b are plate-like members which are formed by bend-pressing rectangular pieces, which are punch-pressed to extend toward the central side from the inner edge of the shell body 304a, to the shell body 104a to be bent to rise from the shell body 104a, as shown in FIG. 10.

In this second embodiment, both sides (above and below the through hole 104d in FIG. 10) across the center of the through hole 304d are provided with the bent pieces 304b, respectively. The two bent pieces 304b are rectangular and have the same shape. When these two bent pieces 304b are bent to the shell body 304a, the two bent pieces 104b are located in parallel to each other and the entire surfaces of the bent pieces 104b face each other. The electric wires 121 which penetrate through the through hole 304d are placed between the two bent pieces 304b which are bent.

The bent pieces 304b are formed with protrusions 304f on outer surfaces 304b1, and concaves 304g at positions corresponding to the protrusions 304f on inner surfaces 304b2.

In this third embodiment, to further raise the gripping force of the bent pieces 304b and the shield ring 105 to grip the leading end 122a of the braiding 122, a structure shown in FIG. 10 is adopted in the bent pieces 304b. When the shield ring 105 is tightened by the protrusions 304f, the leading end 122a is clamped by the shield ring 105 and the protrusions 304f by a big pressure force. Therefore, the leading end 122a is fixed to the shield shell 304 more strongly by the bent pieces 304b and the shield ring 105. Thus, the braiding 122 can be prevented from falling off from the shield shell 304. If the protrusions 304f enter the gaps between fibers in the braiding 122, even if an external force acts onto the braiding 122 in a direction of escaping from the shield shell 304, the braiding 122 is prevented from escaping from the shield shell 304 since the protrusions 304f are caught onto those fibers.

The above protrusions 304f are formed, for example, by locally pushing surfaces (inner surfaces 304b2) opposite to the surfaces (outer surfaces 304b1) where the protrusions 304f are provided in the bent pieces 304b, when the shield shell 304 is bend-pressed. In this case, the bent pieces 304b are formed with the concaves 304g at positions corresponding to the protrusions 304f, as shown in FIG. 10. Thus, by forming the protrusions 304f at the time of bend-pressing, the bent pieces 304b can be easily formed with the protrusions 304f. If the protrusions 304f are formed by locally pushing the surfaces opposite to the surfaces where the protrusions 304f are formed, it becomes easy to adjust the projection height of the protrusions 304f which project from the bent pieces 304b. The method to form the protrusions 304f is not limited to the above method. The protrusions 304f may be formed at the time of punch-pressing, and the protrusions 304f may be formed at desired places on the plate-like metal plate before pressing.

The features of the embodiments of the shield structure, the shield shell and the method of manufacturing the shield connector with electric wire according to the present invention described above are briefly, collectively listed in the following [1] to [8], respectively.

[1] A shield structure including:
a hollow tubular shield member (braiding 122),
a shield shell (104) having a plate-like shell body (104a) which is formed with a through hole (104d), and a plate-like bent piece (104b) which is extended from an inner edge of the shell body that defines the through hole and which is bent to rise from the shell body, and
an annular member (shield ring 105) which surrounds and fastens the bent piece, wherein at least one bent piece of the shield shell is extended from the inner edge of the shell body, and
when the annular member surrounds and fastens the bent piece the outer surface (104b1) of which is covered with the leading end (122a) in the longitudinal direction of the shield member, the leading end is clamped between the annular member and the bent piece.

[2] The shield structure according to [1], wherein the shield shell has a plurality of the bent pieces which are extended from the inner edge of the shell body, and two of the plurality of the bent pieces are formed so that the planes including the bent pieces which are bent are parallel to each other or intersect.

[3] The shield structure according to [2], wherein at least two of the plurality of the bent pieces are formed to be parallel to each other and the entire surfaces of the bent pieces face each other.

[4] The shield structure according to any one of [1] to [3], wherein the shield structure further comprises a housing (housing 102) which holds an electric wire,
the outer surface, which faces the inner surface (104b2) of the bent piece when the shell body is attached to penetrate the through hole, of the housing is flat, and
the inner surface of the bent piece which is fastened by the annular member is supported on the outer surface of the housing.

[5] The shield structure according to any one of [1] to [4], wherein the outer surface of the bent piece is provided with a protrusion (304f) or a ridge (204f).

[6] The shield structure according to [5], wherein the inner surface of the bent piece is formed with a concave (304g) or a groove (204g) at a position corresponding to the protrusion or the ridge.

[7] A shield shell including:
a plate-like shell body which is formed with a through hole, and
at least one bent piece which is extended from an inner edge of the shell body that defines the through hole and is bent to rise from the shell body.

[8] A method of manufacturing a shield connector with electric wire, including:
a pressing step of forming a shield shell, which has a plate-like shell body which is formed with a through hole, and at least one bent piece which is extended from an inner edge of the shell body that defines the through hole and which is bent to rise from the shell body, by pressing a metal plate,
an arranging step of arranging the leading end in the longitudinal direction of the shield member which is formed into a hollow tubular shape to the shell body to surround the through hole, and
a fastening step of clamping the leading end in the longitudinal direction of the shield member between the bent piece and the annular member by surrounding and fastening the bent piece, the outer surface of which is covered with the leading end, with the annular member.

Although the invention is described in detail with reference to the specific embodiments, it is apparent that various modifications and amendments may be made by those skilled in the art without departing from the spirit and scope of the invention.

According to the present invention, the shield shell can be manufactured by a simpler method, and the braiding can be attached to the shield shell easily. The present invention which plays the effects is useful in fields which relates to a shield structure, a shield shell and a method of manufacturing a shield connector with electric wire.

What is claimed is:

1. A shield structure comprising:
a hollow tubular shield member, the shield member being hollow in a longitudinal direction and having a first end and a second end, opposite to the first end, in the longitudinal direction;
a shield shell having a plate-like shell body which is formed with a through hole, and a plate-like bent piece which is extended from an inner edge of the shell body that defines the through hole and which is bent to rise from the shell body; and
an annular member which surrounds and fastens the bent piece,
wherein at least one bent piece of the shield shell is extended from the inner edge of the shell body, and
when the annular member surrounds and fastens the bent piece, with an outer surface of the bent piece being covered with the first end of the shield member, the first end of the shield member is clamped between the annular member and the bent piece.

2. The shield structure according to claim 1, wherein the shield shell has a plurality of bent pieces including the at least one bent piece, the plurality of bent pieces being extended from the inner edge of the shell body, and
two of the plurality of the bent pieces are formed so that planes including the bent pieces which are bent are parallel to each other or intersect.

3. The shield structure according to claim 2, wherein at least two of the plurality of bent pieces are formed to be parallel to each other and the entire surfaces of the at least two of the bent pieces face each other.

4. The shield structure according to claim 1, further comprising a housing which holds an electric wire,
wherein an outer surface of the housing, which faces an inner surface of the bent piece when the shell body is attached to penetrate the through hole, is flat, and
the inner surface of the bent piece which is fastened by the annular member is supported on the outer surface of the housing.

5. The shield structure according to claim 1, wherein the outer surface of the bent piece is provided with a protrusion or a ridge.

6. The shield structure according to claim 5, wherein an inner surface of the bent piece is formed with a concave or a groove at a position corresponding to the protrusion or the ridge.

7. A method of manufacturing a shield connector with electric wire comprising:
- a pressing step of forming a shield shell by pressing a metal plate, the shield shell having a plate-like shell body formed with a through hole, and at least one bent piece extended from an inner edge of the shell body that defines the through hole, the at least one bent piece being bent to rise from the shell body;
- an arranging step of arranging a first end, in a longitudinal direction, of a shield member to the shell body to surround the through hole, the shield member being formed in a hollow tubular shape, wherein the shield member is hollow in the longitudinal direction and includes the first end and a second end, opposite to the first end, in the longitudinal direction; and
- a fastening step of clamping the first end of the shield member between the bent piece and an annular member by surrounding and fastening the bent piece, an outer surface of which is covered with the leading end of the shield member, with the annular member.

\* \* \* \* \*